United States Patent
Bistrika et al.

(10) Patent No.: US 11,824,229 B2
(45) Date of Patent: Nov. 21, 2023

(54) MANUFACTURING ENHANCED GRAPHITE METALLIC BIPOLAR PLATE MATERIALS

(71) Applicant: NEXGEN Materials, LLC, Sandy, UT (US)

(72) Inventors: Alexander A. Bistrika, Corvallis, OR (US); Jacob Donovan Tenhoff, San Francisco, CA (US); Erica Viola Lewis, Portland, OR (US); Jordan Loos, Springfield, OR (US); Gerard W. Kesselring, West Linn, OR (US); Bill Jay Brooks, Lebanon, OR (US)

(73) Assignee: NEXGEN Materials, LLC, Sandy, UT (US)

( * ) Notice: Subject to any disclaimer, the term of this patent is extended or adjusted under 35 U.S.C. 154(b) by 0 days.

(21) Appl. No.: 16/649,172

(22) PCT Filed: Sep. 20, 2018

(86) PCT No.: PCT/US2018/051881
§ 371 (c)(1),
(2) Date: Mar. 20, 2020

(87) PCT Pub. No.: WO2019/060503
PCT Pub. Date: Mar. 28, 2019

(65) Prior Publication Data
US 2020/0295383 A1 Sep. 17, 2020

Related U.S. Application Data

(60) Provisional application No. 62/560,768, filed on Sep. 20, 2017.

(51) Int. Cl.
*H01M 8/0228* (2016.01)
*C23F 17/00* (2006.01)
(Continued)

(52) U.S. Cl.
CPC .......... *H01M 8/0228* (2013.01); *C23F 17/00* (2013.01); *C25D 5/48* (2013.01); *C25D 5/54* (2013.01);
(Continued)

(58) Field of Classification Search
CPC ............. H01M 8/0206; H01M 8/0226; H01M 8/0228; H01M 8/0232; H01M 8/0245; C25D 5/48; C25D 5/54; C25D 5/605
(Continued)

(56) References Cited

U.S. PATENT DOCUMENTS 5,902,762 A   5/1999   Mercuri et al.
6,613,252 B2  9/2003   Norley et al.
(Continued)

FOREIGN PATENT DOCUMENTS

CN   105742660 A   7/2016
EP   1715538 A1   10/2006

OTHER PUBLICATIONS

Cartula et al., "Electroless plating of graphite with copper and nickel," Journal of the Electrochemical Society, 1995, 142(12): 4084-4090.
(Continued)

*Primary Examiner* — James M Erwin
(74) *Attorney, Agent, or Firm* — Michael Best & Friedrich LLP

(57) ABSTRACT

The present invention includes methods of manufacturing a metal infused graphitic material. Also described is how this device may be rendered impermeable. The present invention includes the electroplating/electroless deposition of metal on exposed internal and external surfaces of a porous graphitic substrate. The deposition of metal on the internal structure is accomplished by replacing the void space in the porous substrate with an electrolyte solution containing dissolved
(Continued)

metallic species. The plating is initiated either through electrochemical means, electroless means, chemical vapor deposition means, or other means obvious to one familiar in the art of metal plating. A post-deposition bath is also described wherein the plating may be removed from one or both sides of the external surface without impacting the internal pore plating.

12 Claims, 3 Drawing Sheets

(51) Int. Cl.
*C25D 5/48* (2006.01)
*C25D 5/54* (2006.01)
*F28F 21/02* (2006.01)
*H01L 23/373* (2006.01)
*H01M 8/0206* (2016.01)
*H01M 8/0232* (2016.01)
*H01M 8/0245* (2016.01)
*H01M 8/18* (2006.01)
*C25D 5/00* (2006.01)
*H01M 8/0226* (2016.01)
*H01M 8/10* (2016.01)

(52) U.S. Cl.
CPC ............. *C25D 5/605* (2020.08); *F28F 21/02* (2013.01); *H01L 23/3736* (2013.01); *H01M 8/0206* (2013.01); *H01M 8/0226* (2013.01); *H01M 8/0232* (2013.01); *H01M 8/0245* (2013.01); *H01M 8/188* (2013.01); *H01M 2008/1095* (2013.01)

(58) Field of Classification Search
USPC ........................................................ 429/518
See application file for complete search history.

(56) References Cited

U.S. PATENT DOCUMENTS

| | | | |
|---|---|---|---|
| 6,673,289 B2 | 1/2004 | Reynolds, III et al. | |
| 2011/0316040 A1 | 12/2011 | Hirotsuru et al. | |
| 2012/0328789 A1* | 12/2012 | Lu ........................... | C04B 41/52 |
| | | | 427/404 |
| 2013/0032278 A1 | 2/2013 | Ottinger et al. | |
| 2015/0086871 A1* | 3/2015 | Cao ........................ | H01M 4/36 |
| | | | 429/220 |
| 2015/0090434 A1* | 4/2015 | Lemak .................... | C23C 16/26 |
| | | | 165/185 |
| 2017/0229715 A1* | 8/2017 | Chou .................. | H01M 8/0258 |

OTHER PUBLICATIONS

International Search Report and Written Opinion for Application No. PCT/US2018/051881 dated Apr. 19, 2019 (8 pages).

* cited by examiner

MANUFACTURING ENHANCED GRAPHITE METALLIC BIPOLAR PLATE MATERIALS

CROSS-REFERENCE TO RELATED APPLICATIONS

This application is a Unites States National stage application, filed under 35 U.S.C. § 371, of International Application PCT/US18/51881 filed Sep. 20, 2018 which is incorporated by reference herein and which claims the benefit of U.S. Provisional Patent Application No. 62/449,306 filed Sep. 20, 2017 entitled "MANUFACTURING ENHANCED GRAPHITE METALLIC BIPOLAR PLATE MATERIALS".

BACKGROUND OF THE INVENTION

A bipole is a component within an electrochemical stack assembly that can serve several purposes: 1) conduct the electrons in and out of an electrochemical device, 2) physically separate the individual cells making up the stack, 3) contact the reaction surface to the electrical circuit, 4) or as any combination of the prior in which the bipole functions as reaction surface, cell divider, and electrical conduit. The bipole is therefore a critical component to the functionality of an electrochemical cell stack assembly. Stacks containing bipolar plates are commonly found in Redox Flow Batteries, Fuel Cells, and large scale electrochemical production systems. Depending on the system or application, the properties of these bipoles can differ a great deal.

In the flow battery space, most bipoles utilized are a thin (ca. 0.4-1.2 mm) calendared graphite composite, comprising Polytetrafluoroethylene (PTFE) and other synthetic materials as a binder. Proton-exchange membrane Fuel Cell bipoles are often thick (ca. >5 mm), rigid, and consist of machined graphite plates. The material properties of other bipolar materials vary with application according to the specific temperature, chemistry, permeability, and fluid requirements of the application.

The invention contained herein consists of a first part that is a graphitic material and a second part that is a deposited metal. This process will be described in greater detail in the following sections, but a brief background of similar applications will be covered here.

Individual materials and potential applications of the invention have been validated in various industries. Metallic bipolar plates in Proton-exchange membrane fuel cells have been investigated and shown promise. Stainless steel bipolar plates were also adopted in fuel cells and resulting current-voltage curves and lifetime curves were measured. The electrochemical industry, over several years, has validated graphite as the industry standard of bipolar materials due to its high conductivity. The creation of composites that contain graphite and preferred binders, both metallic and nonmetallic, are then used to achieve desired material characteristics.

A flexible graphite composite as described by U.S. Pat. Nos. 5,902,762 and 6,613,252 represents devices that have similar applications to the present invention. U.S. Pat. No. 6,673,289 describes a bipolar device and a process by which flexible graphite foil, produced from expanded graphite particles, is impregnated with resin, embossed, and cured for use "in a proton exchange membrane fuel cell".

SUMMARY OF THE INVENTION

The present invention relates to the modification of flexible expanded graphite foil and rigid body porous graphite materials, the modification of which may be used to exhibit tailored material solutions for the key material properties of fluid impermeability, high temperature stability, mechanical robustness, and high electrical conductivity. Bulk mechanical properties are improved upon by deposition of a metal infrastructure throughout the porous substrate. These key attributes make the invention applicable in many different applications, including, but not limited to: use as bipolar collector plate material; use as components which comprise a part of a Redox Flow Battery system, Fuel Cell reactor stack, or alkaline electrochemical reaction and synthesis devices; use as low-density high-strength components which comprise a part of a mechanical assembly; or use as a high-conductivity, high-ductility transmission line as part of an electrical assembly. The invention described herein can be implemented as a functional bipole, or electrode, in any alkaline or acidic flow-through, or non-flowing electrochemical system.

The invention disclosed herein describes a novel composite structure, and method of manufacturing, that allows for application specific material characteristics to be achieved through material selection and process controls. Moreover, preferential etching of either the exposed graphite or the exposed metal may be used in conjunction with a pore sealing treatment to enable the same invention to meet the needs of both basic and acidic electrolyte systems. This invention also discloses an embodiment in which the foil is infused with a polymer based sealing compound. The present invention differs greatly from the prior art in both method of manufacture and in design flexibility for product characteristics, providing improvements in both areas. The primary similarity between an embodiment of the present invention and the prior art is the use of a polymeric compound to create an impermeable component, however the functional similarities end there. The present invention uses a binding agent that does not require thermal energy to cure and which can be recycled and reused at the end of the product lifecycle, whereas the prior art requires a thermal cure to the polymeric compound in order to use the material. This prevents the prior art material from being recycled and may also prevent the prior art from being tailored to meet a wider array of applications. Furthermore, the underlying infrastructure of the present invention demonstrates a preferential heterogeneous composition of expanded graphite and metal deposits, which is an important material characteristic that provides improved material performance in various applications.

This invention covers the infusion of a porous graphitic substrate with a plurality of constituents that remain inside the porous structure of the substrate. In an embodiment of the present invention, there exists a first part made from porous graphitic material. In one embodiment, the graphitic material may be of an expanded and calendared graphite sheet with anisotropic material characteristics. In another embodiment, the porous graphitic material may be of a sintered carbon substrate with isotropic material characteristics. In another embodiment, the sintered carbon substrate may have anisotropic material characteristics. The voids of the porous first part are partially or fully filled with an intermediary second part, said intermediary second part containing a third part that will remain upon the removal of the intermediary second part. In one embodiment, the third part preferentially consists of metal ions. In one embodiment, the second part is a formulated chemical plating bath. In another embodiment, the second part is a formulated chemical vapor. In another embodiment, the intermediary second part consists of a plurality of parts which may include, but are not limited to, a solvent and a dissolved metal solute.

In an embodiment of the present invention, a first part partially or fully filled with an intermediary second part is subjected to an electrochemical deposition treatment process, which acts upon both the first and intermediary second parts to induce the deposition of the third part onto the surfaces of the first part. In another embodiment, the intermediary second part is subjected to an electroless deposition treatment process. The electrochemical, electroless, or similar deposition process deposits the third part upon the exposed surfaces of the porous first part. When the intermediary second part consists of a solvent and a metal solute, the result of the deposition process is a plated metal surface third part that covers the internal pore structure and external surfaces of the first part. In one embodiment, this process reduces internal void space while simultaneously creating cross-planar metallic bridges within the first part, thereby improving cross-planar electrical and thermal conduction.

In one embodiment, the first part consists of a porous calendared graphite foil having first and second opposed planar surfaces. The first and second opposing graphitic surfaces of the first part may be exposed by etching away the third part after it has been plated to either or both of the opposed planar surfaces and the intermediary second part is removed. In one embodiment, this may be achieved by an acid wash or reverse polarization of the first and third parts in an electrochemical bath.

In another embodiment of the present invention, the remaining void space within the combined first and third parts may be filled with a fourth part, said fourth part consisting of a polymeric composition suitable for the final application. The filling of the remaining voids spaces by the fourth part may be accomplished by a number of different means depending on the choice of material for the fourth part. In one embodiment, the fourth part is infused into the first and third parts by melting the fourth part and partially or fully filling the first and third parts with the molten fourth part before freezing the fourth part inside the pores of the first and third parts. In one embodiment, the fourth part consists of a hydrophobic compound, such as beeswax and other non-polar low-melting point chemicals (<120 degrees Celsius). In another embodiment, the fourth part may be mixed with additives that affect the melting point and electrical properties of the final composition. In one embodiment, the fourth part is heated to above its melting point while staying below the fourth parts flash point. In another embodiment, the fourth part is kept below the flash point of the material while attempting to minimize viscosity. In an embodiment wherein the fourth part is a non-polar compound, the metal-plated graphite substrate may be submerged into a liquid bath of the fourth part, enabling the fourth part to wick into the accessible void spaces of the combined first and third parts. The combined first, third, and fourth parts are removed from the heated bath of fourth part material, allowed to cool, and cleaned off of any excess fourth part coating the opposed planar surfaces of the first and third parts. In one embodiment, when cooled, the fourth part changes phase into a solid, thus yielding a hydrophobic, electrically conductive, impermeable sheet having two opposed planar surfaces.

This invention seeks to improve upon the bipolar materials disclosed in prior art and which are currently used in redox flow batteries, fuel cells, and other electrochemical systems applications. A bipole fulfills three critical needs within an electrochemical system: 1) it prevents the electrochemically active species from mixing physically or ionically, 2) it completes the electrical connection between the individual cells of a stack assembly and the source/load circuit of the system, and 3) it survives the harsh environments of an electrochemical system without degradation to or loss of the other two critical performance metrics. The present invention improves upon all three of these quantifiable performance metrics. For the most common use cases, the present invention allows one to customize a bipole design to meet the survivability and low electrical resistance requirements of both acidic and alkaline electrochemical systems or secondary batteries.

In another embodiment of the present invention, the third part is chosen so as to increase the strength-to-weight ratio of the combined first and third parts. In one embodiment, the strength-to-weight ratio is increased so as to improve the manufacturability of electrochemical systems. In another embodiment of the present invention, the strength-to-weight ratio is optimized in order for the final product to be used as a component in a mechanical assembly. In another embodiment of the present invention, the first part is plated twice by two different formulations of an intermediary second part; said formations and plating processes chosen such that the first part is internally plated with a third part designed to increase the strength-to-weight ratio while the first part is externally plated with a third part designed to improve surface electrical conduction.

Lab results indicate that even incremental improvements in resistivity may lead to significant improvements in voltaic efficiency for a secondary battery or in an electrochemical system comprised of many cells. By replacing the pockets of air or other gasses inside the first part with bridges of the second part, one may provide these incremental improvements to the through-plane conductivity of the material. When combined with the embodiment wherein the untreated void space is partially or fully filled with a fourth part, the completed device achieves the impermeability characteristics required for bipoles in similar electrochemical systems. Furthermore, improving the conductivity of prior-art bipole materials with this process results in another embodiment of the present invention, through which one may reduce the gap between Faradaic and Coulombic efficiencies for aqueous electrochemical systems. In this embodiment, the voltaic efficiency of an aqueous electrochemical system may get closer to the Coulombic efficiency of the particular chemistry, as is typical with non-aqueous chemistries such as in lithium-ion batteries and other secondary batteries. These technical characteristics make the overall battery more efficient and increase its utilized storage capacity. In fuel-cells this translates to better fuel utilization. In an electrochemical synthesis reactor, this embodiment results in higher yield.

In a preferred embodiment of the present invention, the first part shall consist of low-cost porous calendared or sintered graphite material in any combination of calendared expanded graphite foils and/or sintered body graphite. In a preferred embodiment, the use of calendared graphite materials for the first part is a functional improvement over the prior art. In this embodiment of the first part, the individual graphite platelets are oriented such that the majority of the exposed first and second opposed planar surfaces of the first part is comprised of basal plane graphite. This material characteristic of the first part reduces the rate of intercalation and prolongs the life of the bipole in highly corrosive environments if the first and third part of the present invention are subsequently filled, or sealed off, with a fourth part as described above. The intermediary second part shall consist of abundant and inexpensive metal additives and a singular or plurality of readily available and safe solvents. The fourth part shall consist of safe and low-cost wax-like products, such as ethylene-vinyl acetate (EVA), beeswax, ethylene, or paraffin, combined in such ratios as will be needed to yield both a desired melting point for the blend of compounds as well as to provide the impermeability required of the final device. The present invention then allows for application specific chemical treatments and manufacturing processes to be employed such that the inexpensive graphitized carbon material is modified per the invention description above. Impregnation of the first and third parts with the fourth part further isolates any exposure of non-basal plane graphite edge sites, which in turn further improves the life of the bipole and reduces the rate of intercalation and degradation of the carbon scaffold.

In one embodiment the invention is a device consisting of; a first part comprised of porous graphitic material; and a second part comprised of a metallic material plated upon the exposed internal and external surfaces of the first part. In another embodiment the first part is comprised of a compressed expanded-graphite foil, a sintered body graphite element, or any combination thereof, with opposed planar porous surfaces. In another embodiment the second part is a metal chosen to improve the electrical conductivity of the device. In another embodiment the second part is a metal chosen to improve the strength-to-weight ratio of the device. In another embodiment the materials for the second part are chosen to improve chemical stability of the device in alkaline environments. In another embodiment the materials for the second part are chosen to provide chemical stability in a secondary battery. In another embodiment further including a third part comprised of non-polar compounds that fill and seal the void spaces in the device. In another embodiment the second part is preferentially removed from only the exterior surfaces of the first part with an etching process. In another embodiment the third part is chosen from the family of natural and synthetic compounds that exhibit chemical stability in acidic environments. In another embodiment the first and second parts are chosen to improve thermal conductivity of the device for use as a heat spreader. In another embodiment the first and second part are chosen to create a bipolar plate suitable for use in redox flow batteries, fuel cells, and other electrochemical processes. In another embodiment the first and second parts are chosen to enable the device for use as a conductive layer in a semiconductor assembly. In another embodiment the device form factor and percentage of plating by mass are chosen to allow the device to function as a structural member in high strength-to-weight ratio applications.

In another embodiment the invention is a method of manufacturing a device comprised of a first part comprised of porous graphitic material and a second part comprised of a metallic material plated upon the exposed internal and external surfaces of the first part; wherein the first part is subjected to an electrochemical or electroless deposition treatment process to plate the device with the second part. In another embodiment the first part is subjected to a chemical vapor deposition treatment process to plate the device with the second part. In another embodiment it includes the step of washing the treated device with an acid or base wash. In another embodiment it includes the step of etching the device in a gaseous etching system. In another embodiment the first part is first subjected to high temperatures and/or vacuum pressures. In another embodiment the invention includes immersing the device into a molten bath filled with a third part comprised of non-polar natural and/or synthetic compound(s); removing the device from the molten bath; and allowing the third part to solidify inside the pores of the device. In another embodiment the invention includes removing a plurality of layers of the third part from the outside of the device such that the external surfaces of the first part may be partially or fully uncovered.

DETAILED DESCRIPTION OF THE INVENTION

Figure 1:
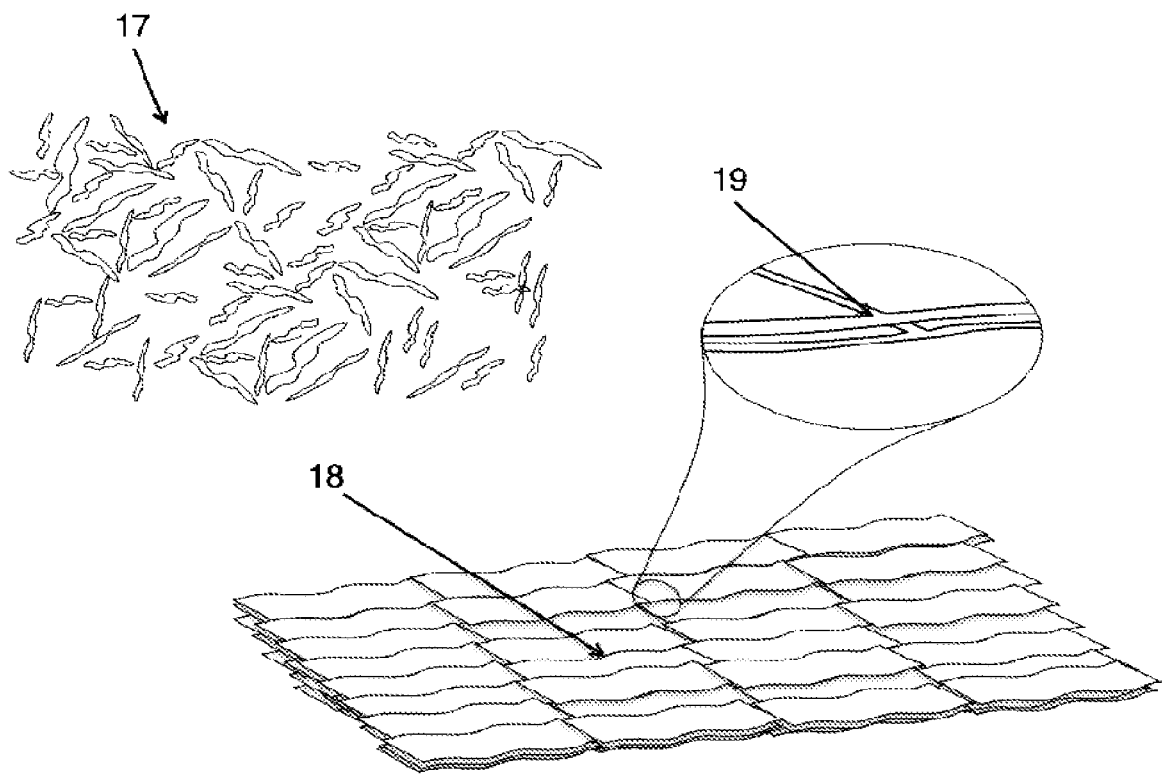
FIG. 1 is a conceptual illustration of expanded graphite pre- and post-compression showing the residual discontinuity in the graphite material.

This invention pertains to the manufacturing process and novelty therein for generating metal-graphite hybrid infrastructure bipolar current collector electrodes and comparable materials. This process can be modified for metal deposition on any graphite material that is porous in nature, including, but not limited to sintered body graphite plates, sheets, rods, bars of the same, compressed expanded graphite, or calendared expanded graphite foil.

I. Terms and Definitions

The following explanations of terms and abbreviations are provided to better describe the present invention and to guide those of ordinary skill in the art in the practice of the present invention. As used herein, the singular forms "a" or "an" or "the" include plural references unless the context clearly dictates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this invention belongs. Although methods and materials similar or equivalent to those described herein can be used in the practice or testing of the present invention, suitable methods and materials are described below. The materials, methods, and examples are illustrative only and not intended to be limiting. Other features of the invention are apparent from the following detailed description and the claims.

Unless otherwise indicated, all numbers expressing quantities of components, percentages, temperatures, times, and so forth, as used in the specification or claims are to be understood as being modified by the term "about." When directly and explicitly distinguishing embodiments from discussed prior art, the embodiment numbers are not approximations unless the word "about" is recited.

For the purposes of this patent, a deposition bath is defined as a solution with metal ion species dissolved in a solvent. Open pores are defined as void spaces that consist of continuous uninterrupted flow paths through the bulk material, with an opening on first and second opposing surfaces. Surface pores are defined as void space in the substrate material with at least one opening on the first or second opposing surface of the substrate, but not both. Internal pores are defined as void spaces which do not have any continuous uninterrupted flow path to any exterior surface of the substrate.

II. Devices Comprising a Bipole

Embodiments of a device, or a component of a device, including at least one bipole prepared by the proposed methods are disclosed.

In a Proton-Exchange Membrane fuel cell (PEMFC) hydrogen is adopted as fuel source to generate electricity from energy released in hydrogen's electrochemical reaction with oxygen. Two main materials are key in PEMFC's. The first is the membrane, which must be ionically conductive to move protons, but not electrically conductive so as to prevent the electrical shorting of the cell. Second is the bipolar electrode materials, which must be electrically conductive to act as a current collector for the electrochemical reaction. These electrode materials would be a direct application of this invention.

In a redox flow battery electrical energy is converted and stored as chemical potential energy in ions dissolved in the electrolyte. Within this system, there are two electrolyte tanks in a redox flow battery, one containing an analyte and the other a catholyte. Both electrolytes are kept in separate flow circuits while they are pumped through a stack of electrochemical reaction cells. It is critical that the two electrolytes do not mix while flowing through the reaction cells, as this causes the system to self-discharge, resulting in poor efficiency and energy losses. This loss is called crossover and is managed within these systems by carefully selecting the proton/ion exchange membrane and bipole materials that are used to separate each individual cell within the stack of electrochemical reaction cells. The proposed invention can produce a device capable of satisfying the requirements of a bipole material for a redox flow battery system akin to that described here.

III. Preparation of a Metallic Bipole

Figure 2:
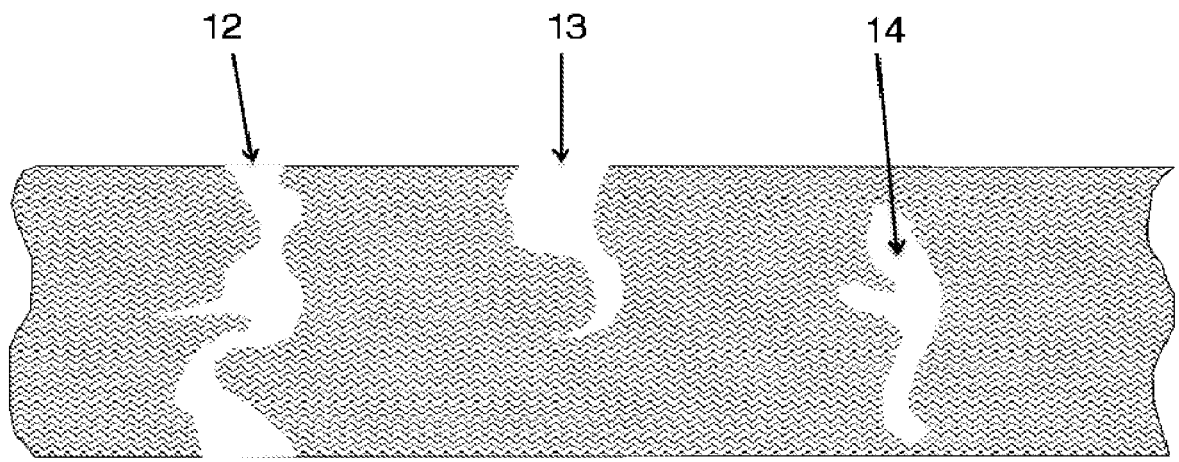
FIG. 2 is a schematic of illustrating open porosity (left), surface porosity (middle), and internal porosity (right) of expanded graphite material.
Figure 3:
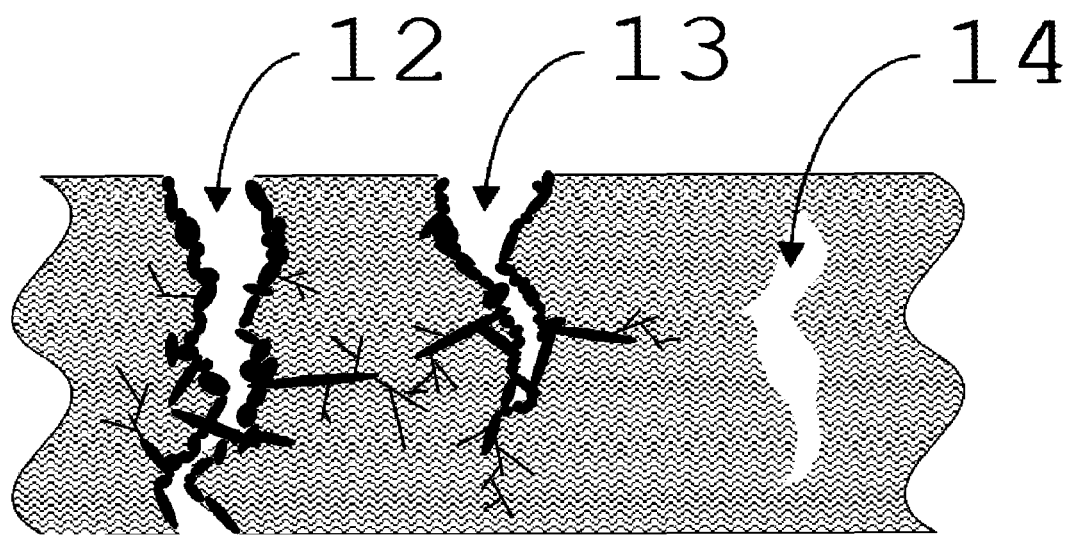
FIG. 3 is a schematic of a pore structure similar to FIG. 3 once metallic deposition has occurred. Tree branch like growths coming from within the pores represent dendrite formation of the application.

Expanded graphite foil is permeable to fluids and ions as part of an electrolyte solution. Insight to this porous structure can be derived from its manufacturing, which is essentially the compression of many graphite flakes, illustrated in FIG. 1. The pores of the graphite foil are essentially void spaces throughout the bulk of the material, and comprise three types of pores illustrated in FIG. 2: open (12), surface (13), and internal (14). These void spaces are filled by air or other gas. When a porous material like the one described is immersed in a liquid, the gas particles will tend to evacuate the void space in all the accessible pores through diffusion into the liquid. The diffusion process may be aided by adding energy into the system by heating the liquid, agitation, or both. The void space is back filled with the surrounding fluid, allowing a solvent to now occupy these pores. This access of the solvent allows for subsequent deposition of metal into the internal pore surface. The electrochemical, electroless, or similar deposition process precipitates the solute metal, resulting in a plated metal surface throughout the internal pore structure of the bulk material. The result of this process is presented visually in FIG. 3.

To precipitate the metal, a graphite foil may be first soaked in an acidic metal salt solution, as mentioned above, to diffuse metal ions into the pore structure. After sufficient time is allowed for diffusion, plating may begin. To plate, a potentiostat may be used, attaching the working electrode lead to the graphite foil while submersing the counter and reference electrodes in the same solution. For this plating process, the potentiostat may be set up for cyclic step chronopotentiometry experiments and alternated between two galvanostat settings. In a first setting, the required potential to achieve 0 mA of current, thus holding equilibrium, is applied to the system, thereby allowing for further diffusion. In a second setting, a potential sufficient to reduce the metal ions inside of and around the foil is applied. By way of example, the potentiostat may be set to hold a current of −500 mA within the second setting to get functional samples of copper-graphite. After several cycles between the first and second setting, the potentiostat may be stopped, leads disconnected, and the plated sample rinsed off and dried in a vacuum oven.

IV. Impregnation

After the material has undergone metal deposition, the remaining void spaces may be filled to ensure impermeability of fluids. For acidic redox flow battery applications, this treatment may be preferred. The material may be sealed by a variety of composition polymer blends, including but not limited beeswax and/or other non-polar chemicals. The filling of these remaining voids spaces by this filling solution is accomplished by first melting the hydrophobic substrate to a point below the chemical's flash point but sufficiently high in temperature to minimize the solution's viscosity when in a liquid state, thereby aiding diffusion of the solution into the pores of the substrate. Finally, the metal-plated graphite substrate is submerged into a liquid bath of the solution, enabling the filling material to wick into the unfilled void spaces of the bulk material. The filled substrate is removed from the heated bath and allowed to cool, during which the filling solution changes phase back to a solid. The resultant device then provides hydrophobic and impermeable characteristics to the treated substrate. The resultant material will have no exposed metal at the surface, with the hydrophobic filler sealing off the metallic layers.

V. Large Scale Manufacturing

Figure 4:
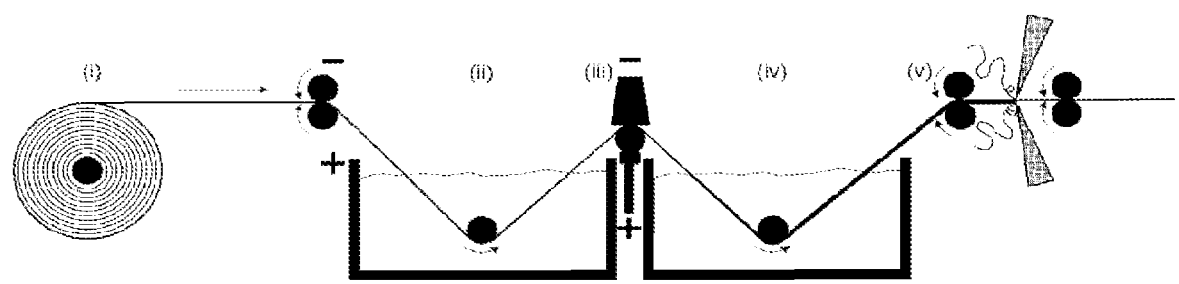
FIG. 4 is a schematic illustrating the deposition and impregnation process of expanded graphite foil.

This process may be realized in a variety of embodiments at a manufacturing scale. One of these embodiments is a continuous roll-to-roll process depicted in FIG. 4, where a roll (i) is set on a spindle and unwound by the precalendaring rolls passed through a metal deposition bath (ii), and a subsequent impregnation bath (iv) and is then collected by the calendaring rolls. The now metal filled and impregnated material is fed through a cleaning system (v) to remove any excess material with the objective of exposing the exterior surface so that the only treatment left in the device is inside the pore structure of the material.

Figure 5:
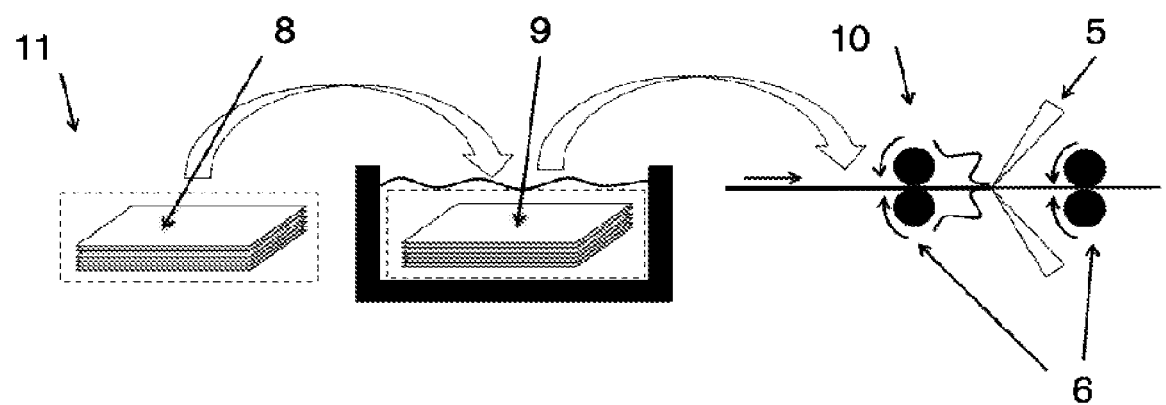
FIG. 5 is a schematic illustrating a batch process for processing porous graphite materials and doctoring process.

In another embodiment batch processing is adopted, illustrated in FIG. 5. Pieces of an expanded graphite foil are placed on a rack (8) and immersed into a metal deposition bath (9). The sheets are then transferred to a filling impregnation bath (not pictured), and finally they undergo a post-processing step similar to that described above (5,6,10).

VI. Examples

As mentioned above, the potential applications include, but are not limited to, use in redox flow batteries, Proton- Exchange membrane fuel cells and electrochemical processes. The claimed improvements in electrical conductivity and impermeability serve to both increase the lifespan of bipole parts in the applications and increase the efficiency with which they operate. The invention also serves to improve the materials resistance to oxidation or corrosion, which is a useful attribute in many other applications, including bur not limited to alkaline environments. The claimed increases in tensile strength and other mechanical properties of the material will reduce the chances that bipole plates become damaged by normal operations, and will allow for thinner plates to be used, thus further reducing overall resistance of the bipole. Finally, the invention and method of manufacturing this new composite material can be custom tailored to fit a variety of needs in other fields of application that include, but are not limited to: structural members for applications requiring high strength-to-weight ratios (e.g. aerospace, aeronautics, transportation), thermal heat sinks (e.g. electronics cooling, thermal management), heat spreaders (e.g. satellite thermal distribution, etc), non-secondary battery related electrochemical reaction chamber components, and high-frequency signal transmission.

What is claimed is:

1. A device comprising,
   a first part comprised of a porous graphitic material;
   a second part comprised of a metallic material plated upon the exposed surfaces of the first part;
   wherein the second part is removed from the exterior surfaces of the first part via an etching process; and
   wherein the metallic material comprises copper.

2. The device according to claim 1, wherein the first part comprises one of a group including a compressed expanded-graphite foil, a sintered body graphite element, or any combination thereof, with opposed planar porous surfaces.

3. The device according to claim 1, further comprising a third part comprised of a non-polar compound that fills and seals a void space in the device.

4. A device according to claim 1, wherein the first part and the second part are a bipolar plate configured to be used in a redox flow battery, and a fuel cell.

5. A device according to claim 1, wherein the first and second parts are chosen to enable the device for use as a conductive layer in a semiconductor assembly.

6. A method of manufacturing a copper metal hybrid infrastructure bipolar material from porous graphite materials, comprising the steps of:
   providing a raw material comprising: a flexible graphite foil produced by compressing expanded graphite, a sintered body graphite element, or
   a composite of the flexible graphite foil and the sintered body graphite element;
   immersing the raw material in a deposition bath and subjecting the raw material to an electrochemical or electroless deposition treatment process;
   wherein the immersed raw material is pulled from the deposition bath and subsequently moved to an acid or base wash.

7. The method of claim 6 further comprising the step of, drawing a vacuum around the raw material prior to immersing the raw material in the deposition bath.

8. The method of claim 6, wherein the raw material is immersed in the deposition bath for a period between 1 second and 1 minute.

9. The method of claim 6, wherein the raw material is immersed in the deposition bath for a period greater than 1 minute.

10. A method of manufacturing a copper metal hybrid infrastructure bipolar material from porous graphite materials, comprising the steps of:
    providing a raw material comprising: a flexible graphite foil produced by compressing expanded graphite, a sintered body graphite element, or
    a composite of the flexible graphite foil and the sintered body graphite element;
    immersing the raw material in a deposition bath and subjecting the raw material to an electrochemical or electroless deposition treatment process;
    wherein the immersed raw material is pulled from the deposition bath and subsequently moved to a gaseous etching system.

11. The method of claim 6, wherein the raw material is immersed in the deposition bath via a batch process.

12. The method of claim 6, wherein the steps are carried out in an environment chamber configured to control temperature and pressure.

* * * * *